United States Patent
Hayes et al.

(10) Patent No.: US 12,538,844 B2
(45) Date of Patent: Jan. 27, 2026

(54) DOUBLE-SIDED MULTICHIP PACKAGES

(71) Applicant: NXP USA, Inc., Austin, TX (US)

(72) Inventors: Scott M. Hayes, Chandler, AZ (US);
Wen Hung Huang, Kaosiung (TW);
Michael B. Vincent, Chandler, AZ (US);
Antonius Hendrikus Jozef Kamphuis, Nijmegen (NL); Zhiwei Gong, Chandler, AZ (US); Leo van Gemert, Nijmegen (NL)

(73) Assignee: NXP USA, INC., Austin, TX (US)

( * ) Notice: Subject to any disclaimer, the term of this patent is extended or adjusted under 35 U.S.C. 154(b) by 528 days.

(21) Appl. No.: 18/062,445

(22) Filed: Dec. 6, 2022

(65) Prior Publication Data

US 2024/0186301 A1 Jun. 6, 2024

(51) Int. Cl.
*H01L 25/16* (2023.01)
*H01L 21/48* (2006.01)
(Continued)

(52) U.S. Cl.
CPC ........ *H01L 25/162* (2013.01); *H01L 21/4853* (2013.01); *H01L 21/4857* (2013.01); *H01L 21/486* (2013.01); *H01L 21/566* (2013.01); *H01L 23/3128* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 25/165* (2013.01); *H01L 24/16* (2013.01); *H01L 24/32* (2013.01); *H01L 24/73* (2013.01); *H01L 2224/16227* (2013.01);
(Continued)

(58) Field of Classification Search
CPC ............................ H01L 23/5389; H01L 23/66
See application file for complete search history.

(56) References Cited

U.S. PATENT DOCUMENTS

| | | | |
|---|---|---|---|
| 6,274,929 B1 | 8/2001 | Leong et al. | |
| 8,729,714 B1 | 5/2014 | Meyer | |

(Continued)

FOREIGN PATENT DOCUMENTS

| | | |
|---|---|---|
| DE | 10 2013 113 A1 | 7/2014 |
| EP | 3157056 A2 | 4/2017 |

(Continued)

OTHER PUBLICATIONS

U.S. Appl. No. 18/458,705; not yet published; 35 pages, filed Aug. 30, 2023.

(Continued)

*Primary Examiner* — Evan G Clinton (57) ABSTRACT

An electronic device package and method of fabricating such a package includes a first and second components encapsulated in a volume of molding material. A surface of the first component is bonded to a surface of the second component. Upper and lower sets of redistribution lowers that include, respectively, first and second sets of conductive interconnects are formed on opposite sides of the molding material. A through-package interconnect passes through the volume of molding material and has ends that terminate, respectively, within the upper set of redistribution layers and within the lower set of redistribution layers.

24 Claims, 6 Drawing Sheets

(51) Int. Cl.
  *H01L 21/56* (2006.01)
  *H01L 23/31* (2006.01)
  *H01L 23/498* (2006.01)
  *H01L 23/538* (2006.01)
  *H01L 23/00* (2006.01)

(52) U.S. Cl.
  CPC ............... *H01L 2224/32145* (2013.01); *H01L 2224/73253* (2013.01); *H01L 2924/182* (2013.01); *H01L 2924/19101* (2013.01)

(56) References Cited

U.S. PATENT DOCUMENTS

| | | |
|---|---|---|
| 8,754,514 B2 | 6/2014 | Yu et al. |
| 8,765,527 B1 | 7/2014 | Koey |
| 10,347,598 B2 | 7/2019 | Baek et al. |
| 10,580,758 B2 | 3/2020 | Ganesan et al. |
| 11,251,157 B2 | 2/2022 | Yang et al. |
| 2009/0127686 A1* | 5/2009 | Yang ........................ H01L 24/19 257/E23.023 |
| 2012/0261838 A1 | 10/2012 | Braunisch et al. |
| 2015/0255411 A1 | 9/2015 | Karhade |
| 2016/0086930 A1 | 3/2016 | Koey et al. |
| 2017/0207197 A1* | 7/2017 | Yu ........................... H01L 24/92 |
| 2020/0364600 A1 | 11/2020 | Elsherbini et al. |
| 2021/0111156 A1 | 4/2021 | Elsherbini et al. |
| 2021/0265274 A1 | 8/2021 | Joo et al. |
| 2021/0384134 A1* | 12/2021 | Liu ........................ H01L 21/768 |
| 2022/0262766 A1 | 8/2022 | Chen et al. |

FOREIGN PATENT DOCUMENTS

| | | | |
|---|---|---|---|
| EP | 4024450 A1 | 7/2022 | |
| WO | WO-2013127035 A1 * | 9/2013 | ............. H01L 25/03 |

OTHER PUBLICATIONS

U.S. Appl. No. 18/458,705; Non Final Action issued on Nov. 5, 2025; 15 pages.

* cited by examiner

DOUBLE-SIDED MULTICHIP PACKAGES

FIELD OF THE INVENTION

Embodiments of the subject matter described herein relate to polymeric packages for semiconductor devices and other electronic components and methods of fabricating such packages.

BACKGROUND OF THE INVENTION

Semiconductor devices and other electronic devices are frequently assembled into packages to protect the devices from damage and to provide macroscopic electrical contacts. Packages can be made of various materials including polymers and ceramics. It can be desirable to assemble multiple devices within one package in order to reduce the volume required for various components in larger assemblies. It can also be desirable to interconnect multiple devices within a multi-chip package to save space and/or to improve device performance characteristics such as maximum clock speeds, power dissipation, and the like.

SUMMARY OF THE INVENTION

In an example embodiment, an electronic device package 9 that includes a first electronic component having a first surface provided with electrical contact pads and a second surface opposite the first surface; and a second electronic component having a first surface provided with electrical contact pads and a second surface opposite the first surface. The second electronic component is bonded to the second surface of the first electronic component.

This example also includes a volume of molding material that encapsulates the first electronic component and the second electronic component; an upper set of redistribution layers and a lower set of redistribution layers.

The upper set of redistribution layers is formed from layers of electrically-insulating material that surround a first set of electrically conductive interconnects, wherein the upper set of redistribution layers extends from a first surface of the volume of molding material to an upper redistribution layer ("RDL") surface.

The lower set of redistribution layers are formed from layers of electrically-insulating material that surround a second set of electrically conductive interconnects. The lower set of redistribution layers extends from a second surface of the volume of molding material that is opposite the first surface of the volume of molding material to a lower RDL surface.

The package further includes a through-package interconnect that passes through the volume of molding material. The through-package interconnect has ends that terminate, respectively, within the upper set of redistribution layers and within the lower set of redistribution layers. The second electronic component is bonded to the second surface of the first electronic component.

In another example embodiment, a method of forming an electronic device package, includes encapsulating first and second electronic components within a volume of molding material. The first electronic component has a first surface provided with electrical contact pads and a second surface opposite the first surface. The second electronic component has a first surface provided with electrical contact pads and a second surface opposite the first surface.

The method also includes forming upper and lower sets of redistribution layers. The upper set of redistribution layers is formed from layers of electrically-insulating material that surround a first set of electrically conductive interconnects. The upper set of redistribution layers extends from a first surface of the volume of molding material to an upper redistribution layer ("RDL") surface. The lower set of redistribution layers is formed from layers of electrically-insulating material that surround a second set of electrically conductive interconnects. The lower set of redistribution layers extends from a second surface of the volume of molding material that is opposite the first surface of the volume of molding material to a lower RDL surface.

The method also includes forming a through-package interconnect that passes through the volume of molding material, wherein the through-package interconnect electrically couples one or more interconnects belonging to the upper set of redistribution layers with one or more interconnects belonging to the lower set of redistribution layers.

In one or more such embodiments, the second surface of the first electronic component is bonded to the second surface of the first electronic component.

In another example embodiment, An electronic device package, includes first and second electronic components and a volume of molding material that encapsulates the first electronic component and the second electronic component. The first electronic component has a first surface provided with electrical contact pads and a second surface opposite the first surface; and the second electronic component has a first surface provided with electrical contact pads and a second surface opposite the first surface. The second surface of the first electronic component is bonded to the second surface of the second electronic component.

The package also includes upper and lower sets of redistribution layers. The upper set of redistribution layers is formed from layers of electrically-insulating material that surround a first set of electrically conductive interconnects. The upper set of redistribution layers extends from a first surface of the volume of molding material to an upper redistribution layer ("RDL") surface. The lower set of redistribution layers is formed from layers of electrically-insulating material that surround a second set of electrically conductive interconnects. the lower set of redistribution layers extends from a second surface of the volume of molding material that is opposite the first surface of the volume of molding material to a lower RDL surface.

The package also includes through-package interconnect that passes through the volume of molding material, wherein the through-package interconnect electrically couples one or more interconnects belonging to the upper set of redistribution layers with one or more interconnects belonging to the lower set of redistribution layers.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may be use any suitable processes including those that omit steps described above, perform those steps and similar steps in different orders, and the like. It will also be appreciated that well-known features may be omitted for clarity.

Previous approaches to multichip packaging include so-called "2D integration" and "2.5D integration" in which multiple devices, including semiconductor device substrates (or "chips") are placed side-by side on a carrier and then interconnected by routing interconnects through interposers placed above or below the carrier. Other approaches, referred to as "3D integration," can include stacking multiple devices on top of each other and interconnecting them using vias and/or other structures to interconnect the die and components in different layers or tiers in a vertical arrangement.

Previous approaches including those described above can have disadvantages that can be addressed by applying methods disclosed herein to produce multichip packages. As an example, methods for fabricating multichip packages according to embodiments described herein enable the placement of semiconductor die and/or other components having different footprints and thicknesses in dense arrangements by allowing the die and components to be embedded in multiple packaging layers and/or across the layers.

Figure 1:
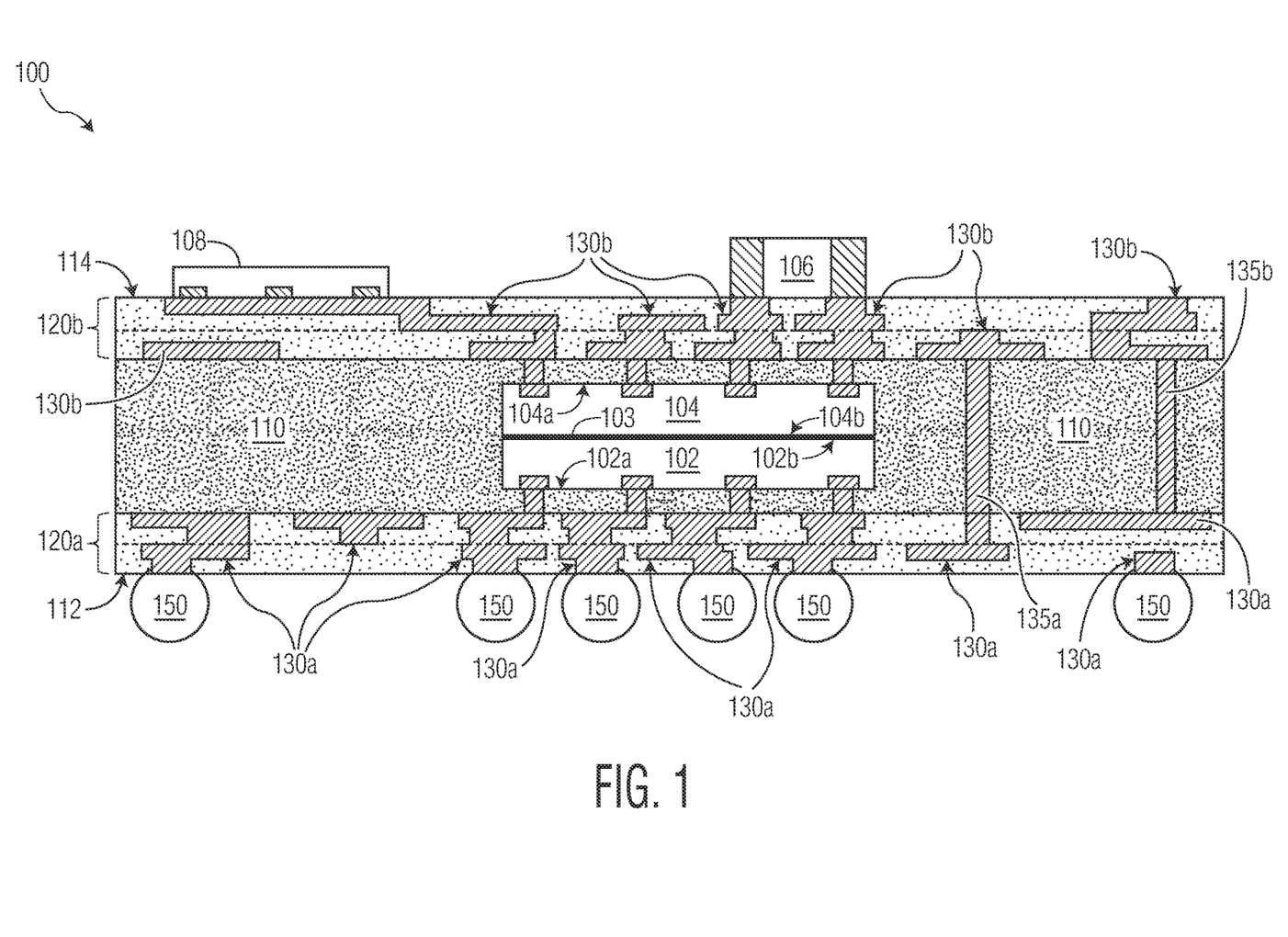
FIG. 1 is a cross-sectional illustration of an example multi-chip package according to one or more embodiments.

Along these lines, FIG. 1 shows an example package 100 according to embodiments herein. Methods of fabricating the example package 100 and similar multichip packages will be discussed further below in connection with FIG. 2. The example package 100 is formed from a volume of molding material 110 that encapsulates at least a first die 102 and a second die 104. Accordingly, embodiments herein can accommodate a wide range of die footprints and thickness by adjusting the thickness of the volume of molding material 110. The example package 100 also includes a component 106 and a component 108 disposed on top of a set of laminated redistribution layers 120 having electrically conductive interconnects 130 routed within. In this example, the component 106 is representative of discrete component such as a resistor, capacitor, or the like which may be significantly thicker than electronic device die similar to the die 102, 104. Embodiments herein can also accommodate various additional die, packaged die, or other components disposed above redistribution layers 120 and the routing of the interconnects 130 as needed to accommodate a particular set of die and/or other components.

As explained further below, interconnects 130 in one or more embodiments herein can be routed within the redistribution layers 120 and the volume of molding material 110 to provide connections between components disposed on or within different portions of a package (e.g., the package 100 and also to provide connections to external contact structures (e.g., the solder bumps 150). In the example of FIG. 1, the package 100 has a lower redistribution layer surface (the lower RDL surface 112) and an upper redistribution layer surface (the upper RDL surface 114). Interconnects 130 extend through the redistribution layers 120 to provide external contact areas that are provided with solder bumps 150 to allow the package 100 to be placed on a circuit board, for example. It will be understood that the package 100 is shown with solder bumps 150 on a lower redistribution layer surface (the lower RDL surface 112) for purposes of illustration and that embodiments herein are not limited to utilizing solder bumps or any other specific bonding technologies. Furthermore, it will be appreciated that packages according to embodiments herein are not limited to having electrical contacts on only one surface, or only type of electrical contacts.

It will be understood that packages according to embodiments herein may include a greater or fewer number of die than pictured in FIG. 1 and that various arrangements of die with varying sizes and configurations are possible. For example, in embodiments herein, a package may include die configured to be electrically coupled to contacts (i.e., interconnects 130) using any number of suitable methods, including examples ball bonding, thermocompression bonding, flip chip bonding, solder reflow bonding, and so on as nonlimiting examples.

The bulk of multichip packages according to embodiments herein (e.g., the package 100 as shown in FIG. 1) can be formed entirely from polymeric materials (e.g., molding material 110 and additional polymeric materials forming redistribution layers 120), in contrast to other 3D integration or substrate embedding approaches that require the use of selectively hollowed out printed circuit boards with one or more core layers selectively removed to allow placement of die within voids in the circuit board(s). Advantageously, methods herein allow die having widely disparate sizes and thickness to be integrated within a single package, and, as shown in FIG. 1, it is not necessary in embodiments herein that any particular die be disposed at the same depth as other any die, as in many previous approaches.

The molding material 110 and related molding materials herein can be any suitable material including, as one nonlimiting example, epoxy molding compound (EMC) which can include silica and other fillers. As shown, the package 100 includes a first set of redistribution layers 120 (the redistribution layers 120a) and a second set of redistribution layers 120 (the redistribution layers 120b), separated from each other by the volume of molding material 110. Redistribution layers 120 may be formed using any suitable materials, including, as nonlimiting examples: polyimide, epoxy, Polybenzoxazole (PBO), Ajinomoto build-up film (ABF) coating, or dry film materials. In one or more embodiments, one or more redistribution layers 120 are formed from the same material as the volume of molding material 110. In one or more embodiments, each redistribution layer 120 is formed from the same material as each other redistribution layer 120, while in one or more other embodiments, one or more different materials are used for certain redistribution layers 120.

As shown, the die 102 and the die 104 are both encapsulated by the volume molding material 110. The die 102 has a first surface 102a that includes contact pads which can be bonded to electrically conductive interconnects, as shown, and a second surface 102b opposite the first surface 102a. It will be understood that the die 102 is depicted with copper pillars on the first surface 102a that are suitable connecting to conductive interconnects via electroplating for the purposes of illustration and that, in one or more embodiments, a die such as the die 102 may instead be a die with contacts configured for thermocompression bonding, ball bonding, solder reflow bonding, flip-chip bonding or any other suitable method. Similarly, the die 104 has a first surface 104a provided with electrical contacts and a second surface 104b disposed opposite from the first surface 104a.

In this example, the die 102 and 104 are positioned "face to face" (or "back to back") with the second surface 102b of the die 102 bonded to the second surface 104b of the die 104 such that the first surface 102a of the die 102 is facing toward the interconnects 130b of the redistribution layers 120b and the first surface 104a of the die 104 is facing toward the interconnects 130a of the redistribution layers 120a. The die 102, 104 may be bonded using any suitable methods and materials, including, as non-limiting examples: bonding using dry films, metal loaded pastes, or unloaded pastes. In one or more embodiments, the respective second surfaces 102b, 104b of the die 102, 104 are bonded via a bonding material 103 as shown. In one or more embodiments the bonding material 103 has a thickness of approximately 5-50 μm.

As shown, the additional components 106, 108 are disposed above the first set of redistribution layers 120a and electrically coupled to various interconnects 130a. As above, the component 106 is illustrative of components such as a discrete resistors, capacitors, and inductors which may be significantly thicker than a semiconductor device die. The component 106 can also be illustrative of substrates and packages containing multiple discrete components. In one or more embodiments such components are incorporated into a multichip package using techniques described further below in connection with FIG. 2, for example.

The package 100 includes external contacts (e.g., solder bumps 150 as shown in FIG. 1) which are bonded and electrically coupled to portions of the interconnects 130 that extend through the redistribution layers 120 to the lower RDL surface 112 of the package 100. The package 100 includes one or more through-package interconnects 135 (e.g., the through-package interconnects 135a, 135b as shown in FIG. 1). These through-package interconnects originate within a first redistribution layer 120 (e.g., one of the redistribution layers 120a), and pass through the entire thickness of the volume of molding material 110, terminating in another redistribution layer 120 (e.g., one or more of the redistribution layers 120b).

In one or more embodiments, a through-package interconnect 135 (e.g., the through-package interconnect 135a or the through-package interconnect 135b) may be used to electrically interconnect a die on the upper RDL surface 114 to a die within the volume of molding material 110 (e.g., the die 102). In one or more embodiments, a through-package interconnect 135 (e.g., the through-package interconnect 135a or the through-package interconnect 135b) may be used to electrically interconnect a die on the upper RDL surface 114 to a contact pad on the lower RDL surface (e.g., one or more of the interconnects 130b and/or a solder bumps 150 or similar structure that provides external contact to devices within a package 100). In one or more embodiments, a through-package interconnect 135 (e.g., the through-package interconnect 135a or the through-package interconnect 135b) may be used to electrically interconnect a first die inside the volume of molding material 110 (e.g., the die 102) to a second die within the volume of molding material 110 (e.g., the die 104).

It will be understood that the description of the package 100 above is intended as an example and that nothing herein is intended to limit embodiments to only two die molded within a package, such as the package 100, to only two through-package interconnects 135 or to only two die on the upper RDL surface 114. It will be further understood that components such as the component 106, 108 or any other suitable components may be attached to the upper RDL surface 114 by any suitable method including ball bonding, compression bonding, solder reflow and the like and that different die may be attached by different methods.

Figure 2:
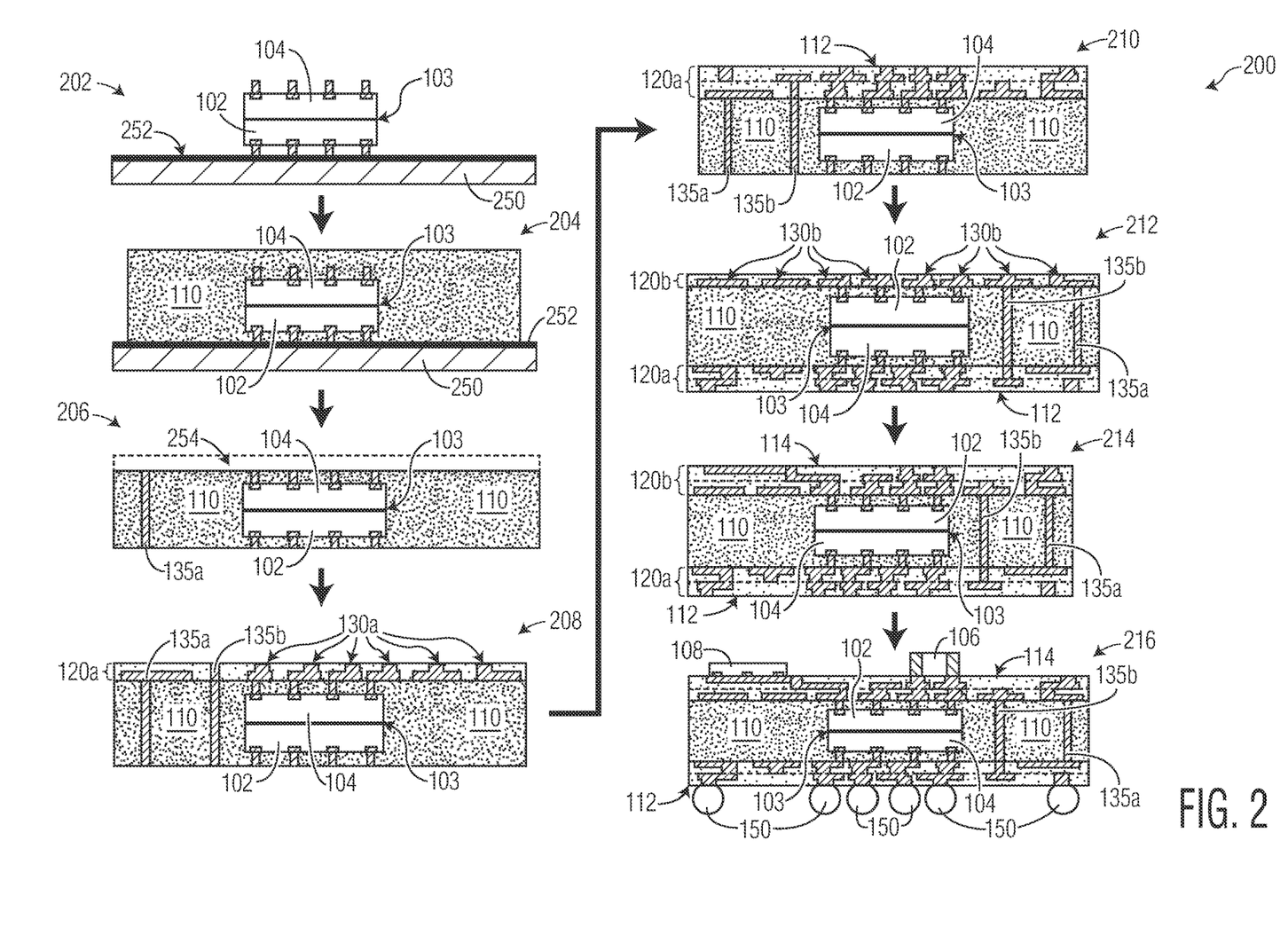
FIG. 2 is a cross-sectional illustration of steps in an example process for fabricating the multi-chip package of FIG. 1.

FIG. 2 illustrates steps in an example process for fabricating a multichip package (e.g., the package 100 of FIG. 1) according to embodiments herein. Accordingly, FIG. 2 illustrates the steps 202, 204, 208, 210, 212, 214, and 216 of the process 200 which are described with reference to the package 100 and the components shown in FIG. 1.

First, at step 202, the die 102 is provided on a carrier substrate 250. The die 104 is placed on top of the die 102 in a "back-to-back" arrangement (i.e., the surface 102a is bonded to the surface 104b as shown in FIG. 1). A release film 252 may be optionally disposed on the carrier substrate 250 between the carrier substrate 250 and the die 102 and can be used to allow the carrier substrate 250 to be removed as described in connection with step 206, below.

At step 204, the volume of molding material 110 is formed, encapsulating the die 102, 104. The molding material 110 may be formed by any suitable process. As nonlimiting examples, the molding material 110 may be dispensed as a liquid, powder, dry film, or paste and compression or injection molded around the die 102, 104, followed by a thermally-activated, chemically-activated, or light-activated curing process, or any other suitable process. The lower RDL surface 112 and the upper RDL surface 114 of the package 100 will ultimately be formed on opposite surfaces of the volume of molding material 110, as shown in FIG. 1.

At step 206, the molding material 110, now encapsulating the die 102, 104, is separated from the carrier substrate 250. In one or more embodiments this can be accomplished by removal of the release film 252 to expose another surface of the molding material 110 in addition to the surface already exposed. The molding material 110 is selectively removed (i.e., thinned) from the region 254 by any suitable process including dry polishing, wet polishing, and/or chemical-mechanical polishing (CMP) to expose the contact areas of the die 104. Once the molding material 110 has been thinned, the molding material 110 is patterned by any suitable process including drilling or etching to form one or more electrically conductive through-package interconnects 135, such as the through-package interconnect 135a as shown at step 206. It will be understood that, in or more embodiments, two or more through-package interconnects 135 are formed at step 206 or a similar step.

In or more embodiments, one or more through-package interconnects are formed by drilling or otherwise etching a monolithic hole which is then filled with conductive material using any suitable process such as electroplating. For instance, the through-package interconnect 135a may be formed at step 206 by drilling a continuous hole though the volume of molding material 110 and plating the hole with a suitable metal, allowing the through-package interconnect to terminate at an interconnect 130a disposed between volume of molding material 110, and the lower RDL surface 112 which is formed in a subsequent step of the process 200 or a related process. In the example of FIG. 2, the through-package interconnect 135a is terminated at an interconnect 130a in a redistribution layer 120a that is in direct contact with the volume of molding material 110.

At step 208, one or more redistribution layers 120 (i.e., redistribution layers 120a) that include electrically conductive interconnects 130 (i.e., interconnects 130a) are formed. It will be appreciated that the number of redistribution layers 120 and sequencing of the formation of those layers can vary depending on specific die to be incorporated in the resulting package and the number and arrangement of desired electrical connections to those die. In this example, an additional through-package interconnect (i.e., the through-package interconnect 135b) is formed, which extends through the volume of molding material 110 and also through one or more of the redistribution layers 120a, as shown. In addition, the through-package interconnect 135a is electrically coupled to one or more of the interconnects 130a within the redistribution layer(s) 120a formed during step 208.

In one or more embodiments, as shown at step 208, a through-package interconnect 135 such as the through-package interconnect 135b may be formed by drilling or etching a monolithic hole that passes through both the volume of molding material 110 and one or more redistribution layers 120a, followed by plating of the hole with a suitable metal.

The redistribution layers 120 and the interconnects 130 within those layers, as shown in FIG. 2 and elsewhere, can be formed in a sequential manner using any suitable processes. As one nonlimiting example, a first layer of interconnects 130 may be deposited and patterned on an exposed surface of the molding material 110, followed by formation of a first redistribution layer 120 around them. This process may be repeated to build up subsequent redistribution layers 120 and the respective portion of the interconnects 130 within. As another nonlimiting example, the interconnects can be formed at least in part using electroplating processes or any other suitable methods.

At step 210, one or more additional redistribution layers 120a including additional interconnects 130a are formed. In this example, the through-package interconnect 135b is coupled to one or more interconnects 130a such that the through-package interconnects 135a, 135b terminate within different redistribution layers 120a. It will be understood that nothing in this example is intended to require more than one through-package interconnect or to require two or more through-package interconnects that terminate within different redistribution layers. Rather, it will be appreciated that the number and arrangement of through-package interconnects may be chosen according to the requirements for a particular set of die being packaged. As shown, at step 210, the lower RDL surface 112 shown in FIG. 1 is formed.

As illustrated at step 212, further processing may be performed with the molding material 110 and the die 102, 104 inverted relative to the orientation depicted in steps 208-210. At step 212, one or more redistribution layers 120 (i.e., the redistribution layers 120b) provided with interconnects 130 (i.e., the interconnects 130b) are formed on a surface of the volume of molding material 110 that is opposite the lower RDL surface 112.

At step 214, one or more additional redistribution layers 120b including additional interconnects 130b are formed above the redistribution layer(s) 120b formed at step 212 to form the upper RDL surface 114.

At step 216, one or more die or other suitable components (e.g., the component 106, 108 as pictured) are bonded to the upper RDL surface and electrically coupled to interconnects 130b. In one or more embodiments, one or more die on the upper RDL surface 114 are coupled via interconnects 130b to a die (e.g., the die 102) disposed within the molding material 110. In one or more embodiments, one or more die on the upper RDL surface 114 are coupled via interconnects 130b and one or more through-package interconnects 135 (e.g., the through-package interconnect 135a and/or the through-package interconnect 135b) to a die (e.g., the die 104) disposed within the molding material 110. In one or more embodiments, one or more die on the upper RDL surface 114 are coupled via interconnects 130b, one or more through-package interconnects 135 (e.g., the through-package interconnect 135a and/or the through-package interconnect 135b), and one or more interconnects 130a of redistribution layers 120a to electrical contacts at the lower RDL surface 112.

At step 216, or at subsequent step, solder bumps 150 or any other suitable electrically conductive structures are bonded to the portions of the interconnects 130a left exposed after step 214. It will be appreciated that nothing herein is intended to limit packages according to embodiments herein to ball-grid array (BGA) packages or similar packages. For example, in one or more embodiments, a package such as the package 100 can instead be provided with bond pads or any other suitable contact configuration (e.g., land-grid array (LGA) pads without solder bumps).

Figure 4:
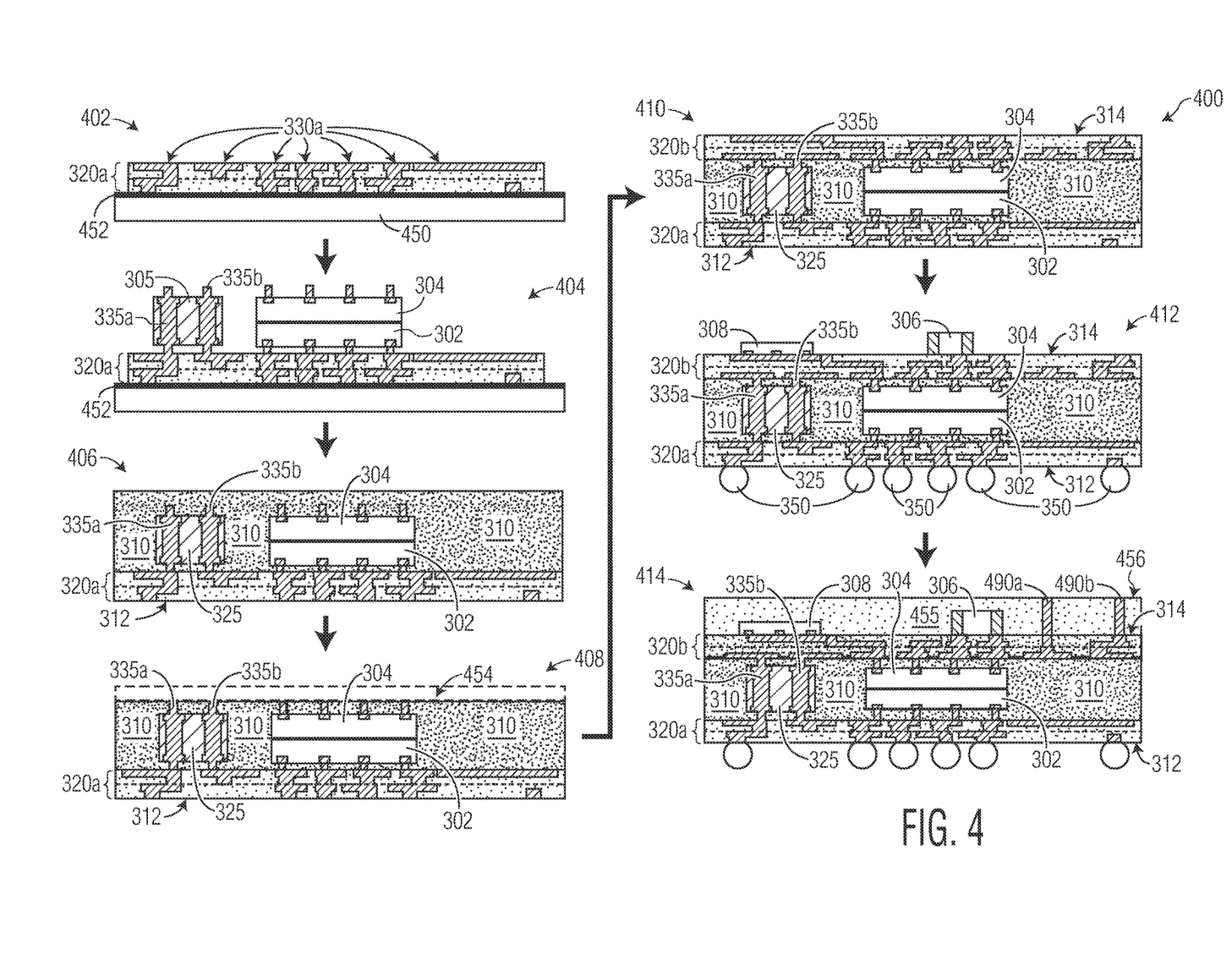
FIG. 4 is a cross-sectional illustration of steps in an example process for fabricating the multi-chip package of FIG. 2.

In one more embodiments, the upper RDL surface 114 and the components disposed on the upper RDL surface 114 are encapsulated in an additional volume of molding material 110 as depicted at step 414 of FIG. 4 or in a similar process step.

Figure 3:
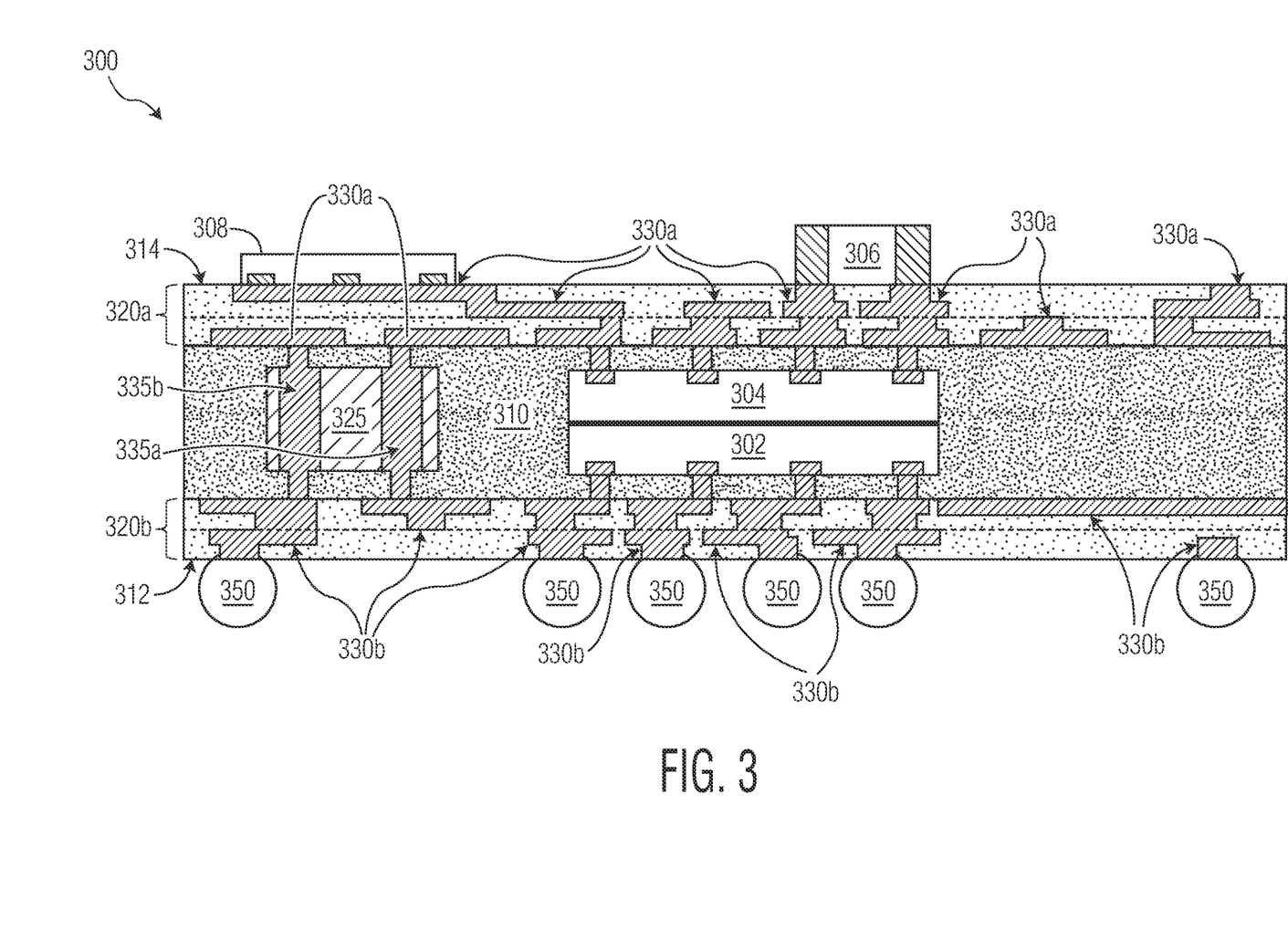
FIG. 3 is a cross-sectional illustration of another example multi-chip package according to one or more embodiments.

FIG. 3 shows an example package 300 according to embodiments herein. Methods of fabricating the example package 300 and similar multichip packages will be discussed further below in connection with FIG. 4. Similarly to the example package 100 of FIG. 1, the package 300 includes die 302, 304 (e.g., the die 102, 104) encapsulated within a volume of molding material 310 (e.g., the molding material 110) and additional die 306, 308 (e.g., the components 106, 108) disposed above the first set of redistribution layers 320a (e.g., the redistribution layers 120a) and electrically coupled to various interconnects 330a (e.g., the interconnects 130a).

The package 300 includes external contacts (i.e., solder bumps 350; e.g., solder bumps 150 as shown in FIG. 1) which are bonded and electrically coupled to portions of the interconnects 330 that extend through the redistribution layers 320 to the lower RDL surface 312 of the package 300. The package 300 includes one or more through-package interconnects 335 (e.g., the through-package interconnects 335a, 335b as shown in FIG. 3). These through-package interconnects 335 originate within a first redistribution layer 320 (e.g., one of the redistribution layers 320a), and pass through the entire thickness of the volume of molding material 310, terminating in another redistribution layer 320 (e.g., one of the redistribution layers 320b). However, in contrast to the through-package interconnects 135 of the package 100, the through-package interconnects 335 also pass through an interposer 325 which is encapsulated in the volume of molding material 310 along with the die 302, 304. In one or more embodiments an interposer such as the interposer 325 can be used to enable a "package first" process in which layers of a package such as the package 300 are formed in a top-to-bottom fashion as will be discussed further in connection with FIG. 4.

An interposer such as the interposer 325 may be formed from any suitable materials using any suitable methods. As one non-limiting example, the interposer can be made from conventional printed circuit board materials fabricated to include through-package interconnects 335. In other non-limiting examples, an interposer can be made from a dielectric or semiconductor material provided with suitable conductive interconnects. Furthermore, it will be understood that nothing herein is intended to limit embodiments herein to a single interposer and that embodiments herein may incorporate any suitable number of die and any suitable number of interposers in any suitable arrangement.

In one or more embodiments, a through-package interconnect 335 (e.g., the through-package interconnect 335a or the through-package interconnect 335b) may be used to electrically interconnect a die on the upper RDL surface 314 to a die within the volume of molding material 310 (e.g., a die 302). In one or more embodiments, a through-package interconnect 335 may be used to electrically interconnect a die on the upper RDL surface 314 to a contact pad on the lower RDL surface 312 (e.g., one or more of the interconnects 320a and/or a solder ball 350 or similar structure that provides external contact to devices within a package 300). In one or more embodiments, a through-package interconnect 335 may be used to electrically interconnect a first die inside the volume of molding material 310 (e.g., the die 302) to a second die within the volume of molding material 310 (e.g., the die 304).

It will be understood that the description of the package 300 above is intended as an example and that nothing herein is intended to limit embodiments to only two die molded within a package such as the package 300, to only two through-package interconnects 335, or to only two die on the upper RDL surface 314. It will be further understood, that die such as the die 306, 308 or any other components may be attached to the upper RDL surface 114 by any suitable method including ball bonding, compression bonding, solder reflow and the like and that different die may be attached by different methods.

Multichip packages according to embodiments herein can be fabricated in a "die first" manner using the example process 200 and/or related processes. Multichip packages according to embodiments herein can also be fabricated a "package first" manner. FIG. 4 illustrates steps in an example "package first" process 400 for fabricating a multichip package (e.g., the package 300) according to embodiments herein. Accordingly, the steps 402, 404, 406, 408, 410, 412, and 414 of the process 400 are illustrated and described with reference to the package 300 and the components shown in FIG. 3.

First, at step 402 (see steps 208-210 of the example process 200 for comparison), one or more electrically-insulating redistribution layers 320a that include electrically conductive interconnects 330a are formed on a carrier substrate 450. A release film 452 may be optionally disposed on the carrier substrate 450 between the carrier substrate 450 and the redistribution layers 320a and can be used to allow the carrier substrate 450 to be removed as described in connection with step 406 below.

Redistribution layers 320 (e.g., redistribution layers 320a, 302b) and the interconnects 330 (e.g., interconnects 330a, 330b) within those layers as shown in FIG. 3 and elsewhere can be formed in a sequential manner using any suitable processes. As a non-limiting example, at step 402, a first layer of interconnects 330 may be deposited and patterned on an exposed surface of the carrier substrate 450, followed by formation of a first redistribution layer 320a around them. Such a process or related processes may be repeated to build up subsequent redistribution layers 320 and the respective portion of the interconnects 330 within. As another nonlimiting example, interconnects can be formed at least in part using electroplating processes or any other suitable methods.

At step 404, the die 302, 304 and the interposer 325 (which includes the through-package interconnects 335a, 335b) are bonded to contact areas on the exposed surface of the redistribution layers 320a, as shown. Contact areas of the die 302 are bonded to contact areas at the exposed surface of the redistribution layers 320a. In one or more embodiments, the die 304 is bonded as shown to the die 302 after the die 302 has been bonded at the surface of the redistribution layers 320a while in one or more other embodiments, the die 304 is bonded to the die 302 prior to bonding of the die 302 at the surface of the redistribution layers 320a.

At step 406, the volume molding material 310 (e.g., the molding material 110) is formed, encapsulating the die 302, 304 and the interposer 325. The molding material 310 may be formed by any suitable process. As nonlimiting examples, the molding material 310 may be dispensed as a liquid, powder, dry film, or paste and compression or injection molded around the die 302, 304, and the interposer 325, followed by a thermally-activated, chemically-activated, or light-activated curing process, or any other suitable process The upper RDL surface 314 of the package 300 will ultimately be formed on opposite surfaces of the volume of molding material 310, from the lower RDL surface 312 as shown in FIG. 3. As shown, the partially-formed package 300 may be separated from the carrier substrate 450 at step 406 or at any other suitable step of a related process. In one or more embodiments in which a release film such as the release film 452 is used, this can be accomplished by removal of the release film 452 to expose the lower RDL surface 312.

At step 408, the molding material 310 is selectively removed from the region 454 by any suitable process including dry polishing, wet polishing, and/or chemical-mechanical polishing (CMP) to expose the contact areas of the die 302, 304 and the through-package interconnects 335 (e.g., the through-package interconnects 335a, 335b as shown. It will be understood that, in or more embodiments, any suitable number of through-package interconnects 335 are formed at step 404 or a similar step.

At step 410 (see steps 212-214 of the example process 200 for comparison), one or more redistribution layers 320 (i.e., redistribution layers 320b; e.g., redistribution layers 120b) that include electrically conductive interconnects 330 (i.e., interconnects 330a; e.g., interconnects 130a) are formed. It will be appreciated that the number of redistribution layers 320 and sequencing of the formation of those layers can vary depending on specific die to be incorporated in the resulting package and the number and arrangement of desired electrical connections to those die. It will be further understood that the interconnects 330a, 330b may be routed as need to connect to the various die and the through-package interconnect(s) 335. In this example one through-package interconnect 335 (the through-package interconnect 335a contacts an interconnect 330a at the lower RDL surface 312 via an interconnect in an intermediate redistribution layer 320a and (only) a redistribution layer 320b beneath the upper RDL surface 314. Meanwhile, the through-package interconnect 335b only contacts interconnects 330a, 330b that do not extend to the lower RDL surface 312 and the upper RDL surface 314, respectively.

At step 412, additional die (e.g., the die 306, 308) or any other suitable components are bonded and electrically connected to other die and/or external contacts of the package 400 at the upper RDL surface 314. These additional die may be interconnected in any suitable arrangement to die or other components within the molding material 310 (e.g., the die 302 and/or the die 304 or similar die or components) and/or to external contacts at the lower RDL surface 312 or exposed contacts (not shown) at the upper RDL surface 314.

In one or more embodiments, the package 300 is provided with suitable external contacts such as the solder bumps 350 at step 412 or at any other suitable step. It will be appreciated that nothing herein is intended to limit packages according to embodiments herein to ball-grid array (BGA) packages or similar packages. For example, in one or more embodiments, a package such as the package 300, can instead be provided with bond pads or any other suitable contact configuration (e.g., land-grid array (LGA) pads without solder bumps).

In one or more embodiments, at the optional step 414, the upper RDL surface 314 and components disposed at that surface may be encapsulated by an additional volume of molding material 311 which may be any suitable material, including, but not limited to molding material 310/110. In such embodiments, additional interconnects 330 (e.g., the additional interconnects 490a, 490b) from any of the redistribution layers 320 (or from die at the upper RDL surface 314; not shown) may extend through the additional molding material 455 to a surface 456 of the additional molding material 455 to provide additional external contacts.

Figure 5:
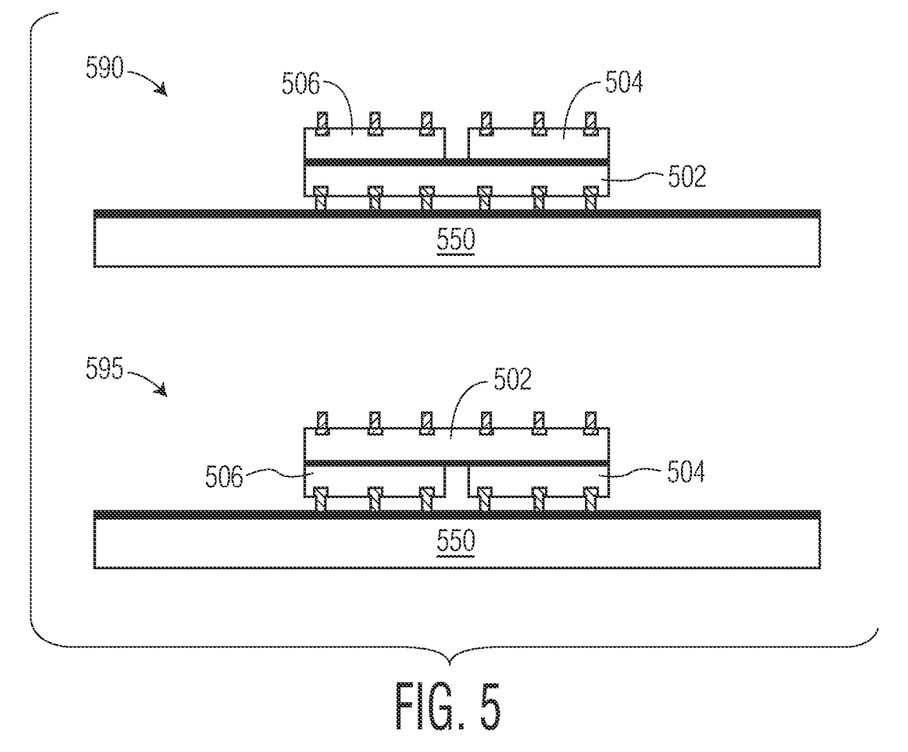
FIG. 5 is a cross-sectional view of two different die arrangements suitable for use in one or more embodiments.

As above, the examples herein are not intended to limit embodiments to a particular arrangement of stacked die in packages such as the packages 100, 300 described in connection with FIGS. 1-4. Accordingly, FIG. 5 shows cross-sectional views of two non-limiting examples of alternative arrangements of more than two die using the die 502, 504, 506 (e.g., any of the die 102/104/302/304). In the example arrangement 590, the die 504, 506 are shown bonded to the die 502 at adjacent locations on a carrier substrate 550 to illustrate that multiple die may be bonded above a single die in embodiments herein. Meanwhile in the example arrangement 590, the die 502 is shown bonded to the die 502 and 504 which are in turn positioned above the carrier substrate 550. It will be understood that any number of die in any combination of the arrangements 590, 595 and related arrangements may be incorporated within any single multi-chip package according to embodiments herein.

Figure 6:
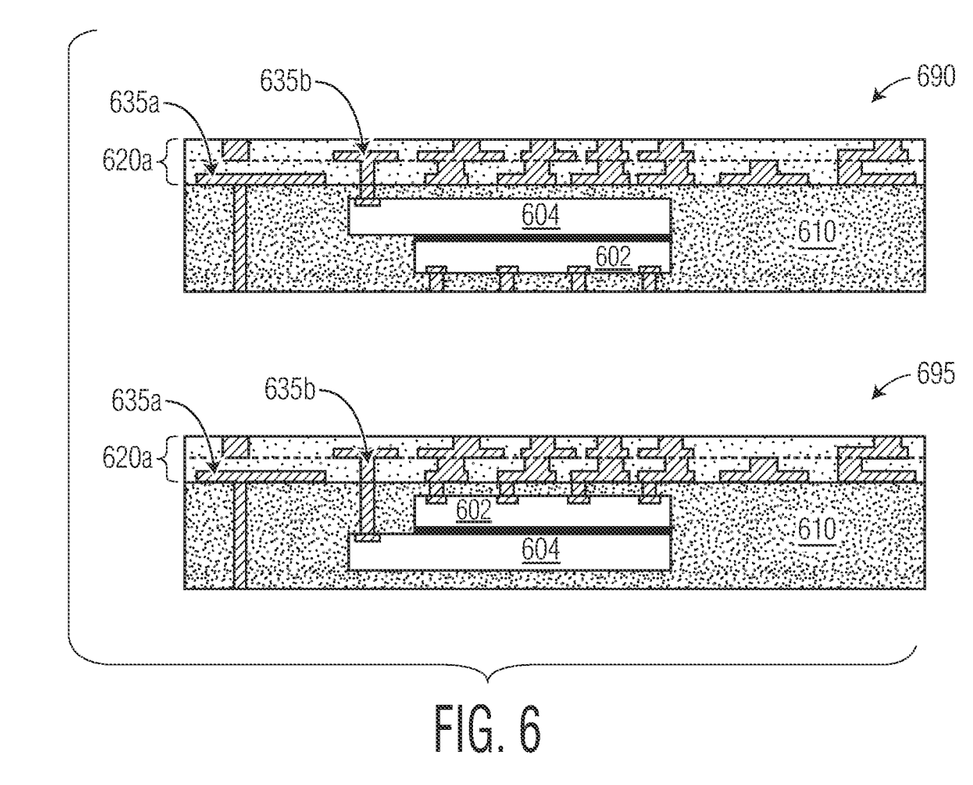
FIG. 6 is a cross-sectional view illustrating two arrangements of through-package interconnects according to one or more embodiments.

FIG. 6 shows cross-sectional views of two non-limiting examples of arrangements through-package interconnects according to one or more embodiments in which a die 602 and a die 604 are encapsulated within a volume of molding material 610 (e.g., the volume of molding material 110/310). The arrangements 690, 695 are depicted after formation of the redistribution layers 620a and through-package interconnects 635a and 695b (compare with through-package interconnects 135a, 135b at step 208 in FIG. 2). As shown in arrangement 690, a through-package interconnect 635 may be a "blind" interconnect that passes through one or more redistribution layers (i.e., a first redistribution layer 620a disposed between the volume of molding material 610 and the RDL surface 612) and into the volume of molding material 610 where it terminates in a contact belonging to the die 604). Meanwhile, in the arrangement 695, the relative positions of the die 602 and 604 are exchanged compared to the arrangement 690 and the through-package interconnect 635b passes adjacent to the die 602 before terminating at the die 604.

It will be understood that the arrangements 690 and 695 are examples for the purposes of illustration and are not intended to limit embodiments to any one configuration of die and other components or any one configuration of redistribution layers and interconnects. Thus a package according to embodiments herein may have any suitable number and arrangement of die and other components; any suitable number and arrangement of redistribution layers with conductive interconnects; and any suitable number and arrangement of through-package interconnects.

VARIOUS EXAMPLES

Features of embodiments may be understood by way of one or more of the following examples:

Example 1: an electronic device package or method of fabricating an electronic device package that includes first electronic component having a first surface provided with electrical contact pads and a second surface opposite the first surface; and a second electronic component having a first surface provided with electrical contact pads and a second surface opposite the first surface; and a volume of molding material that encapsulates the first electronic component and the second electronic component. The second surface of the first electronic component is bonded to the second surface of the second electronic component.

This Example also includes an upper set of redistribution layers formed from layers of electrically-insulating material that surround a first set of electrically conductive interconnects. The upper set of redistribution layers extends from a first surface of the volume of molding material to an upper redistribution layer ("RDL") surface.

This Example also includes a lower set of redistribution layers formed from layers of electrically-insulating material that surround a second set of electrically conductive interconnects. The lower set of redistribution layers extends from a second surface of the volume of molding material that is opposite the first surface of the volume of molding material to a lower RDL surface.

This Example also includes a through-package interconnect that passes through the volume of molding material. The through-package interconnect electrically couples one or more interconnects belonging to the upper set of redistribution layers with one or more interconnects belonging to the lower set of redistribution layers.

Example 2: The package or method of Example 1 that further includes a third electronic component having a first surface provided with electrical contact pads and a second surface opposite the first surface. The third electronic component is disposed adjacent to the second electronic component and the second surface of the third electronic component is bonded to the second surface of the first electronic component.

Example 3: The package or method of Example 1 or Example 2 where one or more contacts of the first electronic component are electrically coupled to electrical contacts on the lower RDL surface via interconnects that pass through the first set of redistribution layers to the lower RDL surface; and one or more contacts of the second electronic component are electrically coupled to electrical contacts on the upper RDL surface via interconnects that pass through the second set of redistribution layers to the upper RDL surface.

Example 4: The package or method of any of Examples 1-3, in which the through-package interconnect passes through the interposer and further including an electrically insulating interposer that is encapsulated within the volume of molding material and disposed adjacent to the first electronic component and the second electronic component.

Example 5: The package or method of any of Examples 1-4 in which at least one contact pad of the first electronic component is coupled to at least one contact pad of the second electronic component via the through-package interconnect.

Example 6: The package or method of any of Examples 1-5, further including a third electronic component disposed on the upper RDL surface above the first set of redistribution layers. The third electronic component has a first surface provided with electrical contact pads and a second surface opposite the first surface. This Example also includes a first set of external contact pads on the upper RDL surface that are electrically coupled to one or more interconnects belonging to the first set of interconnects. The electrical contact pads of the third device are bonded to one or more of the first set of external contact pads on the upper RDL surface and in electrical contact with one or more interconnects belonging to the first set of interconnects via the first set of external contact pads.

Example 7: The package or method of any of Examples 1-6, that includes a second set of external contact pads disposed on the lower RDL surface and electrically coupled to one or more interconnects belonging to the second set of interconnects.

Example 8: The package or method of any of Examples 1-7, where a third electronic component is electrically coupled to at least one interconnect belonging to the second set of interconnects via the through-package interconnect.

Example 9: The package or method of any of Examples 1-9, that includes an additional volume of molding material disposed above the upper RDL surface that encapsulates a third electronic component.

Example 10: The package or method of any of Examples 1-9 that includes a first electronic component having a first surface provided with electrical contact pads and a second surface opposite the first surface; and a second electronic component having a first surface provided with electrical contact pads and a second surface opposite the first surface. The second electronic component is bonded to the second surface of the first electronic component.

This Example also includes a volume of molding material that encapsulates the first electronic component and the second electronic component; an upper set of redistribution layers and a lower set of redistribution layers.

The upper set of redistribution layers is formed from layers of electrically-insulating material that surround a first set of electrically conductive interconnects, wherein the upper set of redistribution layers extends from a first surface of the volume of molding material to an upper redistribution layer ("RDL") surface.

The lower set of redistribution layers are formed from layers of electrically-insulating material that surround a second set of electrically conductive interconnects. The lower set of redistribution layers extends from a second surface of the volume of molding material that is opposite the first surface of the volume of molding material to a lower RDL surface.

This Example includes a through-package interconnect that passes through the volume of molding material. The through-package interconnect has ends that terminate, respectively, within the upper set of redistribution layers and within the lower set of redistribution layers.

Example 11: The package or method of any of Examples 1-10 where the first end of a through-package interconnect terminates within a first intermediate redistribution layer disposed between a first RDL surface and the volume of molding material, wherein the first RDL surface is either the upper RDL surface or the lower RDL surface.

Example 12: The package or method of any of Examples 1-11 in which a second end of the through-package interconnect terminates at a second RDL surface opposite the first RDL surface, wherein the second RDL surface is either the upper RDL surface or the lower RDL surface.

Example 13: The package or method of any of Examples 1-12 in which a second end of the through-package interconnect terminates at a second intermediate redistribution layer disposed between the volume of molding material and a second RDL surface opposite the first RDL surface, wherein the second RDL surface is either the upper redistribution layer or the lower redistribution layer.

Example 14: The package or method of any of Examples 1-13 in which a first conductive interconnect having a first end that that terminates in a first intermediate redistribution layer and a second end that terminates within the volume of molding material at a contact pad on the first surface of the first electronic component; and the first intermediate redistribution layer is disposed within a first set of redistributions layers that is either the upper set of redistribution layers or the lower set of redistribution layers.

Example 15: The package or method of any of Examples 10-14 in which the first surface of the second electronic component is bonded to the second surface of the first electronic component. This Example includes a second conductive interconnect having a first end that that terminates in a second intermediate redistribution layer and a second end that terminates within the volume of molding material at a contact pad on the first surface of the second electronic component. The second intermediate redistribution layer is disposed within the first set of redistributions layers.

Example 16: The package or method of any of Examples 10-15 where the second surface of the second electronic component is bonded to the second surface of the first electronic component. This Example includes a second interconnect having a first end that that terminates in a second intermediate redistribution layer and a second end that terminates within the volume of molding material at a contact pad on the first surface of the second electronic component. The second intermediate redistribution layer is disposed within a second set of redistributions layers that is either the upper set of redistribution layers or the lower set of redistribution layers; and the second set of redistributions layers is on an opposite side of the volume of molding material from the first set of redistribution layers.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. An electronic device package, comprising:
 a first electronic component having a first surface provided with electrical contact pads and a second surface opposite the first surface;
 a second electronic component having a first surface provided with electrical contact pads and a second surface opposite the first surface; wherein the second surface of the first electronic component is bonded to the second surface of the second electronic component;
 a volume of molding material that encapsulates the first electronic component and the second electronic component;
 an upper set of redistribution layers formed from layers of electrically-insulating material that surround a first set of electrically conductive interconnects, wherein the upper set of redistribution layers extends from a first surface of the volume of molding material to an upper redistribution layer ("RDL") surface;
 a lower set of redistribution layers formed from layers of electrically-insulating material that surround a second set of electrically conductive interconnects, wherein the lower set of redistribution layers extends from a second surface of the volume of molding material that is opposite the first surface of the volume of molding material to a lower RDL surface; and
 a through-package interconnect that passes through the volume of molding material, wherein the through-package interconnect electrically couples one or more interconnects belonging to the upper set of redistribution layers with one or more interconnects belonging to the lower set of redistribution layers;
 an electrically insulating interposer that is encapsulated within the volume of molding material and disposed adjacent to the first electronic component and the second electronic component; wherein the through-package interconnect passes through the interposer.

2. The electronic device package of claim 1, further comprising:
a third electronic component having a first surface provided with electrical contact pads and a second surface opposite the first surface;
wherein the third electronic component is disposed adjacent to the second electronic component; and
wherein the second surface of the third electronic component is bonded to the second surface of the first electronic component.

3. The electronic device package of claim 1,
wherein one or more contacts of the first electronic component are electrically coupled to electrical contacts on the lower RDL surface via interconnects that pass through the first set of redistribution layers to the lower RDL surface; and
wherein one or more contacts of the second electronic component are electrically coupled to electrical contacts on the upper RDL surface via interconnects that pass through the second set of redistribution layers to the upper RDL surface.

4. The electronic device package of claim 1, wherein at least one contact pad of the first electronic component is coupled to at least one contact pad of the second electronic component via the through-package interconnect.

5. The electronic device package of claim 1, further comprising:
a third electronic component disposed on the upper RDL surface above the first set of redistribution layers, the third electronic component having a first surface provided with electrical contact pads and a second surface opposite the first surface; and
a first set of external contact pads on the upper RDL surface that are electrically coupled to one or more interconnects belonging to the first set of interconnects;
wherein the electrical contact pads of the third device are bonded to one or more of the first set of external contact pads on the upper RDL surface and in electrical contact with one or more interconnects belonging to the first set of interconnects via the first set of external contact pads.

6. The electronic device package of claim 5, further comprising a second set of external contact pads disposed on the lower RDL surface and electrically coupled to one or more interconnects belonging to the second set of interconnects.

7. The electronic device package of claim 6, wherein the third electronic component is electrically coupled to at least one interconnect belonging to the second set of interconnects via the through-package interconnect.

8. The electronic device package of claim 5, further comprising an additional volume of molding material disposed above the upper RDL surface that encapsulates the third electronic component.

9. An electronic device package, comprising:
a first electronic component having a first surface provided with electrical contact pads and a second surface opposite the first surface;
a second electronic component having a first surface provided with electrical contact pads and a second surface opposite the first surface; wherein the second electronic component is bonded to the second surface of the first electronic component;
a volume of molding material that encapsulates the first electronic component and the second electronic component;
an upper set of redistribution layers formed from layers of electrically-insulating material that surround a first set of electrically conductive interconnects, wherein the upper set of redistribution layers extends from a first surface of the volume of molding material to an upper redistribution layer ("RDL") surface;
a lower set of redistribution layers formed from layers of electrically-insulating material that surround a second set of electrically conductive interconnects, wherein the lower set of redistribution layers extends from a second surface of the volume of molding material that is opposite the first surface of the volume of molding material to a lower RDL surface; and
a through-package interconnect that passes through the volume of molding material, wherein the through-package interconnect has ends that terminate, respectively, within the upper set of redistribution layers and within the lower set of redistribution layers;
an electrically insulating interposer that is encapsulated within the volume of molding material and disposed adjacent to the first electronic component and the second electronic component; wherein the through-package interconnect passes through the interposer.

10. The electronic device package of claim 9, wherein:
the first end of the through-package interconnect terminates within a first intermediate redistribution layer disposed between a first RDL surface and the volume of molding material, wherein the first RDL surface is either the upper RDL surface or the lower RDL surface.

11. The electronic device package of claim 10, wherein:
a second end of the through-package interconnect terminates at a second RDL surface opposite the first RDL surface, wherein the second RDL surface is either the upper RDL surface or the lower RDL surface.

12. The electronic device package of claim 10, wherein:
a second end of the through-package interconnect terminates at a second intermediate redistribution layer disposed between the volume of molding material and a second RDL surface opposite the first RDL surface, wherein the second RDL surface is either the upper RDL surface or the lower RDL surface.

13. The electronic device package of claim 9, further comprising:
a first conductive interconnect having a first end that that terminates in a first intermediate redistribution layer and a second end that terminates within the volume of molding material at a contact pad on the first surface of the first electronic component;
wherein the first intermediate redistribution layer is disposed within a first set of redistributions layers that is either the upper set of redistribution layers or the lower set of redistribution layers.

14. The electronic device package of claim 13,
wherein the second surface of the second electronic component is bonded to the second surface of the first electronic component; and
wherein the electronic device package further comprises:
a second conductive interconnect having a first end that terminates in a second intermediate redistribution layer and a second end that terminates within the volume of molding material at a contact pad on the first surface of the second electronic component; and
wherein the second intermediate redistribution layer is disposed within the first set of redistributions layers.

15. The electronic device package of claim 13,
wherein the second surface of the second electronic component is bonded to the second surface of the first electronic component;
wherein the electronic device package further comprises:
   a second interconnect having a first end that that terminates in a second intermediate redistribution layer and a second end that terminates within the volume of molding material at a contact pad on the first surface of the second electronic component;
   wherein the second intermediate redistribution layer is disposed within a second set of redistributions layers that is either the upper set of redistribution layers or the lower set of redistribution layers; and
   wherein the second set of redistributions layers is on an opposite side of the volume of molding material from the first set of redistribution layers.

16. A method of forming an electronic device package, comprising:
   encapsulating, within a volume of molding material:
      a first electronic component having a first surface provided with electrical contact pads and a second surface opposite the first surface;
      a second electronic component having a first surface provided with electrical contact pads and a second surface opposite the first surface; wherein the second electronic component is bonded to the second surface of the first electronic component;
   forming an upper set of redistribution layers formed from layers of electrically-insulating material that surround a first set of electrically conductive interconnects, wherein the upper set of redistribution layers extends from a first surface of the volume of molding material to an upper redistribution layer ("RDL") surface;
   forming a lower set of redistribution layers formed from layers of electrically-insulating material that surround a second set of electrically conductive interconnects, wherein the lower set of redistribution layers extends from a second surface of the volume of molding material that is opposite the first surface of the volume of molding material to a lower RDL surface; and
   forming a through-package interconnect that passes through the volume of molding material, wherein the through-package interconnect electrically couples one or more interconnects belonging to the upper set of redistribution layers with one or more interconnects belonging to the lower set of redistribution layers;
   forming an electrically insulating interposer that is encapsulated within the volume of molding material and disposed adjacent to the first electronic component and the second electronic component; wherein the through-package interconnect passes through the interposer.

17. The method of claim 16, further comprising:
encapsulating a third electronic component within the volume of molding material, the third electronic component having a first surface provided with electrical contact pads and a second surface opposite the first surface;
wherein the third electronic component is disposed adjacent to the second electronic component; and
wherein the second surface of the third electronic component is bonded to the second surface of the first electronic component.

18. The method of claim 16, further comprising
wherein one or more contacts of the first electronic component are electrically coupled to electrical contacts on the lower RDL surface via interconnects that pass through the first set of redistribution layers to the lower RDL surface; and
wherein one or more contacts of the second electronic component are electrically coupled to electrical contacts on the upper RDL surface via interconnects that pass through the second set of redistribution layers to the upper RDL surface.

19. The method of claim 16, further comprising:
a first conductive interconnect having a first end that that terminates in a first intermediate redistribution layer and a second end that terminates within the volume of molding material at a contact pad on the first surface of the first electronic component;
wherein the first intermediate redistribution layer is disposed within a first set of redistributions layers that is either the upper set of redistribution layers or the lower set of redistribution layers.

20. The method of claim 19,
wherein the second surface of the second electronic component is bonded to the second surface of the first electronic component; and
wherein the method further comprises forming a second conductive interconnect having a first end that that terminates in a second intermediate redistribution layer and a second end that terminates within the volume of molding material at a contact pad on the first surface of the second electronic component; and
wherein the second intermediate redistribution layer is disposed within the first set of redistributions layers.

21. The method of claim 19,
wherein the second surface of the second electronic component is bonded to the second surface of the first electronic component;
wherein the electronic device package further comprises:
   a second interconnect having a first end that that terminates in a second intermediate redistribution layer and a second end that terminates within the volume of molding material at a contact pad on the first surface of the second electronic component;
   wherein the second intermediate redistribution layer is disposed within a second set of redistributions layers that is either the upper set of redistribution layers or the lower set of redistribution layers; and
   wherein the second set of redistributions layers is on an opposite side of the volume of molding material from the first set of redistribution layers.

22. The method of claim 16, wherein:
the first end of the through-package interconnect terminates within a first intermediate redistribution layer disposed between a first RDL surface and the volume of molding material, wherein the first RDL surface is either the upper RDL surface or the lower RDL surface.

23. The method of claim 16, wherein:
the second end of the through-package interconnect terminates at a second RDL surface opposite the first RDL surface, wherein the second RDL surface is either the upper RDL surface or the lower RDL surface.

24. The method of claim 16, wherein:
a second end of the through-package interconnect terminates at a second intermediate redistribution layer disposed between the volume of molding material and a second RDL surface opposite the first RDL surface, wherein the second RDL surface is either the upper RDL surface or the lower RDL surface.

* * * * *